United States Patent [19]

Dugan

[11] 4,321,483
[45] Mar. 23, 1982

[54] APPARATUS FOR DERIVING CLOCK PULSES FROM RETURN-TO-ZERO DATA PULSES

[75] Inventor: John M. Dugan, Garland, Tex.

[73] Assignee: Rockwell International Corporation, El Segundo, Calif.

[21] Appl. No.: 84,336

[22] Filed: Oct. 12, 1979

[51] Int. Cl.³ .............................................. H03L 7/06
[52] U.S. Cl. .................................. 307/269; 307/262; 307/511; 328/63; 328/133; 375/120
[58] Field of Search ............... 307/262, 269, 479, 480, 307/511, 514; 328/63, 133, 155; 375/110, 120

[56] References Cited

U.S. PATENT DOCUMENTS 3,710,140  1/1973  Volmerange ......................... 328/133
4,129,748  12/1978  Saylor ................................. 375/120
4,222,013  9/1980  Bowers et al. ................... 328/155 X Primary Examiner—Eugene R. LaRoche
Attorney, Agent, or Firm—V. Lawrence Sewell; Howard R. Greenberg; H. Fredrick Hamann

[57] ABSTRACT

A phase-locked loop apparatus for deriving clock pulses from return-to-zero data pulses is disclosed. It includes a phase detector for computing the difference, in time, between that portion of a detected data pulse which occurs before a clock pulse edge and the portion after the clock pulse edge. The difference, once computed, is held for a long period thereafter and is used to drive a voltage controlled oscillator. The voltage controlled oscillator generates the clock pulses which are applied to the phase detector and which comprise the output of the apparatus.

8 Claims, 5 Drawing Figures

APPARATUS FOR DERIVING CLOCK PULSES FROM RETURN-TO-ZERO DATA PULSES

BACKGROUND OF THE INVENTION

This invention relates to an apparatus for deriving clock pulses from return-to-zero data pulses.

In a return-to-zero digital pulse train, the presence of a pulse at a predetermined time represents a 1, while the absence of a pulse at that time represents a 0. Accordingly, it is generally necessary to have a train of clock pulses providing timing information in the identification of 1's and 0's among data pulses. In a communication system, it may be necessary to derive or "recover" clock pulses from the occurrences of the 1 pulses in the data.

One kind of circuit used to recover clock pulses from return-to-zero data is the phase-locked loop. In such a circuit, a voltage controlled oscillator generates clock pulses, which are then fed along with the data pulses to a phase detector. The phase detector generates a voltage which is some function of the difference in phase between a data pulse and a corresponding clock pulse. The voltage from the phase detector drives the voltage controlled oscillator to produce clock pulses which stay in phase with the data pulses.

The design of a phase-locked loop clock pulse recovery system becomes more difficult as the loop bandwidth, a measure of the speed of phase correction by the loop, increases. Another source of problems is the possibility of a long series of 0's or no data. In addition, because of the demanding requirements of phase-locked loops, it is important that the transfer function or gain of the phase detector be well behaved.

SUMMARY OF THE INVENTION

In accordance with the present invention, there is provided an apparatus for deriving clock pulses from return-to-zero data pulses. The apparatus includes a phase detector which samples the error in phase between a detected data pulse and an edge of a corresponding clock pulse, and holds the error. The apparatus includes a phase-locked loop which has a voltage controlled oscillator for generating clock pulses at a frequency dependent upon the sampled and held error.

The clock recovery apparatus of the invention has a number of advantages, which will be summarized here and discussed more fully following a description of a preferred embodiment. It is an important advantage that the relationship of the phase detector output voltage to the phase error measured by the detector is substantially independent of the received pattern of data pulses, for low frequency variations of the error. Moreover, the low frequency relationship of the phase detector output voltage to the detected phase error is a continuous, monotonic function through the operating region of the device, with no dead band or regions of erratic gain. During the time between data pulses, the output of the phase detector disclosed herein does not drift, but remains at a nearly constant voltage. During a long period of zeros or no data, the output of the phase detector slowly returns to a voltage selected for optimal phase-locked loop performance. It is of particular value in clock recovery applications that the edge of the derived clock pulse is near the center of its corresponding data pulse.

DESCRIPTION OF A PREFERRED EMBODIMENT

Figure 1:
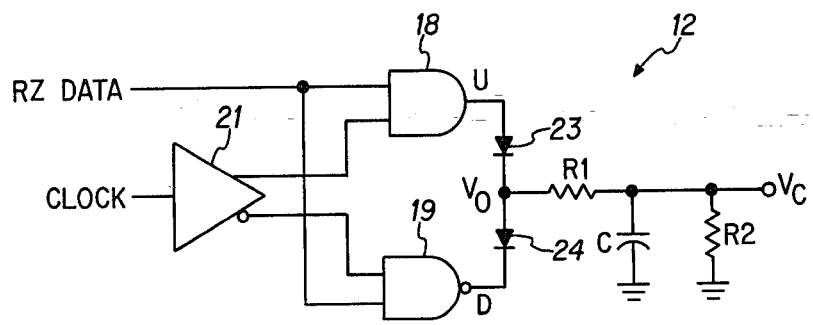
FIG. 1 is a circuit diagram of a phase detector in accordance with the principles of the invention.
Figure 2:
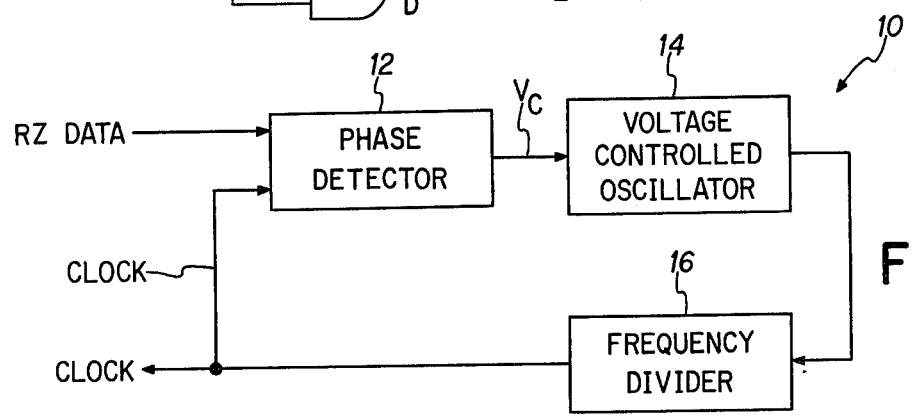
FIG. 2 is a block diagram of an apparatus for deriving clock pulses from data pulses in accordance with the invention.

FIGS. 1 and 2 illustrate a clock signal recovery apparatus according to the invention. The overall apparatus, illustrated in FIG. 2, is indicated by the reference numeral 10. Apparatus 10 is a phase-locked loop, including a phase detector 12 and voltage controlled oscillator 14. As is well-known in the art, the loop can also include a frequency divider 16. The input to the apparatus 10 is a train of return-to-zero data pulses. The output is a train of clock pulses. Voltage controlled oscillator 14 and frequency divider 16 can be of conventional design; the details of phase detector 12 are shown in FIG. 1.

In FIG. 1, it can be seen that phase detector 12 includes an AND gate 18 and a NAND gate 19. The AND gate receives at its inputs the input data pulses and, from an amplifier 21, the clock pulses. NAND gate 19 receives both the data pulses and from an inverting output of amplifier 21, an inverted version of the clock pulses. Diodes 23 and 24 are connected in series between the outputs of the gates 18 and 19, with the anode of diode 23 connected to AND gate 18 and the cathode of diode 24 connected to the output of NAND gate 19. Resistor R1 and capacitor C are connected in series from between the diodes 23 and 24 to ground. Resistor R2, of a much larger resistance than R1, is connected in parallel with capacitor C.

Figure 3:
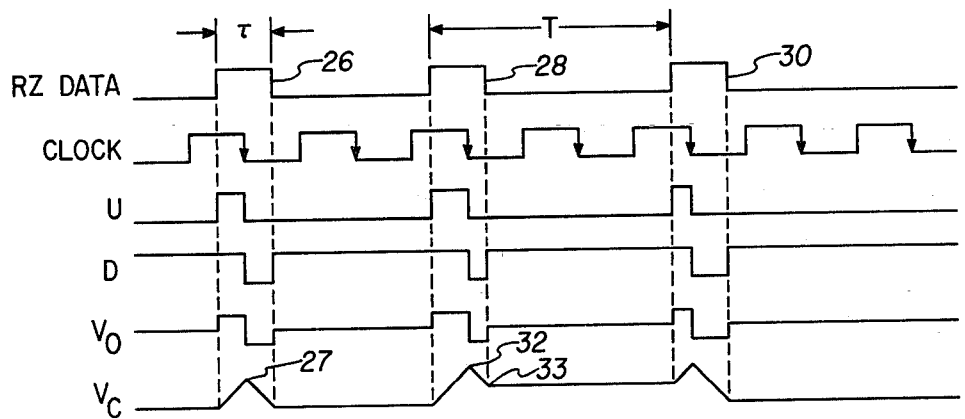
FIG. 3 is a set of waveforms illustrating aspects of the operation of the phase detector of FIG. 1.

FIG. 3 illustrates the operation of the apparatus 10 and in particular of the phase detector 12. The top waveform shows the data pulses, with a slight irregularity in the spacing thereof. Directly below the data pulses are clock pulses, with the falling edge highlighted by arrows. The waveform U is the output of AND gate 18, while waveform D is the output of NAND gate 19. For the outputs of gates 18 and 19, a logic 1 is assumed to be a positive voltage, and a logic 0, a negative voltage of equal magnitude. The waveform $V_o$ is the voltage between diodes 23 and 24. The voltage $V_c$ is the output of phase detector 12 and the input to voltage control oscillator 14.

As seen beneath the first data pulse 26, the waveform U becomes positive for the duration of data pulse 26 before the falling edge of the clock. Voltage D becomes negative for the duration of data pulse 26 after the clock edge. The voltage $V_o$ is therefore positive before the clock edge and negative afterwards. As a result, capacitor C is charged for the duration of data pulse 26 before the clock edge to a positive value 27, and discharged after the clock edge back to zero. The input to the voltage controlled oscillator 14 remains zero until the occurrence of the next data pulse 28.

Data pulse 28 occurs early with respect to its corresponding clock pulse, making the duration of data pulse 28 before the clock edge longer than its duration after the clock edge. As a result, $V_c$ increases to a value 32, then decreases to a value 33 which is greater than zero. The voltage $V_c$ stays at a value near the value 33 until data pulse 30. The discharge time constant of capacitor C, set by the values C and R2 can be selected so that $V_c$ very slowly returns to zero, in the absence of further data pulses.

Data pulse 30 illustrates the effect on voltage $V_c$ of a data pulse which occurs late. Pulse 30 is as late with respect to its associated clock pulse, as data pulse 28 was early. As a result, $V_c$ reaches zero at the time of the falling edge of data pulse 30.

To understand the operation of the apparatus 10, consider the effect of an early arriving pulse such as pulse 28, followed by pulses properly spaced with respect to pulse 28 and the previous frequency of the clock. When voltage $V_c$ is left with the non-zero value 33, voltage controlled oscillator 14 is driven to produce output pulses at a somewhat higher frequency. This causes the clock pulses into phase detector 12 to be at a somewhat higher frequency. The increased clock pulse frequency will cause data pulse 30 and subsequent pulses to occur progressively less early with respect to the clock edges, until the level of $V_c$ has decreased to zero between data pulses. At that point, the clock pulses will be occuring at a frequency consistent with the data pulses and synchronized with the falling edge of the clock near the middle of the data pulse.

The present invention has several advantages as compared with other apparatus using phase-locked loops for clock recovery. One technique uses an analog multiplier (mixer) or a digital multiplier (exclusive-OR circuit) as a phase detector in a phase-locked loop. The output of the multiplier phase detector is proportional to the phase difference between the data pulse and the clock pulse. The relationship of the phase detector output voltage to the phase difference between the clock and the data pulse will be referred to herein as the "gain" of the phase detector.

A disadvantage of the multiplier type phase detector is that its gain is inversely proportional to the sampling interval of the data. The sampling interval is the time designated as T in FIG. 3. Important gain-dependent characteristics of the phase-locked loop such as the loop bandwidth and capture range are therefore highly dependent on the data pattern. In the present invention, with phase detector 12, the DC or low frequency gain is not dependent on the sampling interval.

A further problem with a multiplier type phase detector is that in wide loop bandwidth applications, the continuous action of the phase detector drives the voltage controlled oscillator frequency toward its center frequency during the interval between data pulses. Therefore, when the phase-locked loop is locked to data rates offset from the center frequency, the clock output by the system will jitter due to the changing voltage controlled oscillator frequency. The jitter will increase as the number of 0's between data pulses increases. In the phase detector of the present invention, the output voltage $V_c$ stays practically constant between data pulses, so that there is no such jitter introduced.

Another kind of clock recovery system uses an edge alignment phase detector in a phase-locked loop. One disadvantage of this kind is the relatively large number of components required. Operationally speaking, it is difficult to design an edge alignment phase detector which does not have gain variations around zero phase error. The portion of the operating characteristic in question is illustrated by reference to FIGS. 4a and 4b.

Figure 4A:
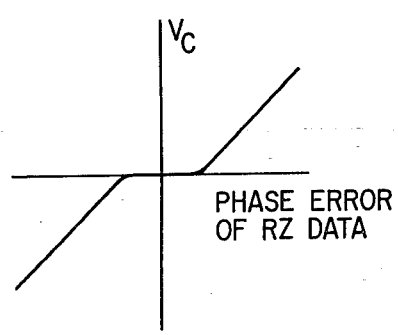
FIGS. 4a and 4b illustrate the relationship of phase detector output versus input, for a prior art phase detector and for the detector of FIG. 1, respectively.
Figure 4B:
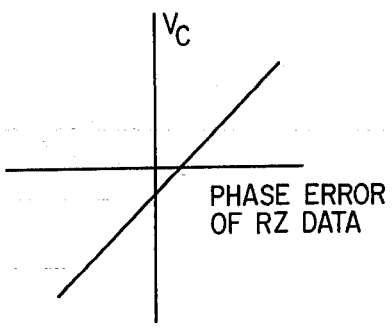

FIG. 4a illustrates the low frequency gain of a phase detector, having an undesirable dead band around zero phase error, wherein $V_c$ exhibits very little increase or decrease for changes in phase error. This critical region around zero phase error can also contain erratic gain variations, which are likewise undesirable. It is the erratic gain variations around zero phase error which are a particular problem with edge alignment phase detectors. By contrast, FIG. 4b illustrates that the low frequency gain of the phase detector 12 is a continuous monotonic function throughout the operating region, with no dead band or erratic gain regions.

Another type of phase detector used in a phase-locked loop for clock recovery uses a sample and hold technique. In this case, the clock signal is converted into a triangular or sawtooth waveform, which is sampled synchronously with an edge of the data pulse. This method becomes increasingly difficult to implement as the data rate increases, since the aperture time of the sampling operation must be small compared to the period of the clock waveform. Consequently, this technique is limited to lower frequency phase-locked loops.

It is an important advantage of the present invention that the center clock frequency of the voltage controlled oscillator 14 can be selected to correspond to the nominal bit rate of the data pulses. This can be achieved, for example, by connecting resistor R2 to a selected reference voltage other than ground, if the frequency of the voltage controlled oscillator with $V_c$ equal to zero differs from the expected frequency of the data pulses. This becomes beneficial in the absence of data pulses, because the clock frequency will remain near that of the expected data. If the clock frequency were to move to a widely different frequency in the absence of data, it might be impossible, depending on the loop characteristics, for the phase-locked loop to capture once the data pulses resumed.

A further advantage of the present invention is that a synchronization is achieved in which the clock edge is near the center of the corresponding data pulse. This is predicted by the equation:

$$P = \frac{R1C}{\tau} [\ln(e^{\tau/R1C} + 1) - \ln 2]$$

where P is the fraction of the data pulse width $\tau$ which elapses prior to the clock edge. As $R1C/\tau$ increases, the value of P approaches 0.5.

Thus the apparatus of the present invention has a number of advantages, including a phase detector with a well behaved transfer function and a low frequency gain which is not significantly affected by the data pattern. The output of the phase detector remains at a constant voltage between data pulses, and can be forced to a selected voltage in the absence of data pulses. As is advantageous in this type of circuit, the clock edge occurs near the center of the data pulse.

I claim:

1. Apparatus for deriving clock pulses from data pulses, comprising:
   means for sampling the error in phase between a portion of a data pulse substantially away from the edge thereof and an edge of a corresponding clock pulse, and for holding said error; and
   a phase locked loop including means for generating said clock pulses at a frequency dependent on said held error.

2. The apparatus of claim 1, further including means for accummulating the sampled and held error for a plurality of data pulses.

3. The apparatus of claim 1, wherein said means for sampling comprises means for detecting the difference, in time, between the duration of said data pulse before said clock pulse edge and the duration after said edge.

4. The apparatus of claim 3, wherein said means for detecting includes:
- an AND gate with the data pulses and the clock pulses applied at the inputs thereof;
- a NAND gate with said clock pulses inverted and said data pulses applied at the inputs thereof;
- a pair of diodes connected in series to conduct current from the output of the AND gate to the output of the NAND gate; and
- a capacitive circuit connected to a common point between the diodes,
- whereby current from the AND gate can charge the capacitive circuit during the coincidence of a clock pulse and a data pulse, and current from the NAND gate can discharge the capacitive circuit during coincidence of a data pulse and an inverted clock pulse.

5. The apparatus of claim 3, wherein said means for detecting include:
- means for progressively changing a signal in a first direction during that portion of the data pulse occurring before said clock pulse edge, and
- means for changing said signal in a second direction opposite said first direction, during that portion of said data pulse after said clock pulse edge.

6. The apparatus of claim 5, wherein said means for sampling include means for providing said means for changing with an input having a uniform pulse height and a well defined pulse edge corresponding to the beginning of said data pulse.

7. The apparatus of claim 6, wherein said means for progressively changing includes means for charging a capacitor.

8. Apparatus for deriving clock pulses from data pulses, comprising:
- means for progressively changing a voltage in a first direction during that portion of a data pulse occurring before a selected edge of a corresponding clock pulse;
- means for changing said voltage in a second direction opposite said first direction, during that portion of said data pulse after said clock pulse edge; and
- phase-locked loop means, including a voltage controlled oscillator driven by said voltage, for generating said clock pulses.

* * * * *